United States Patent
Gu et al.

(10) Patent No.: US 10,749,009 B1
(45) Date of Patent: Aug. 18, 2020

(54) PROCESS OF FABRICATING HIGH EFFICIENCY, HIGH LINEARITY N-POLAR GALLIUM-NITRIDE (GAN) TRANSISTORS

(71) Applicant: Qorvo US, Inc., Greensboro, NC (US)

(72) Inventors: Xing Gu, Allen, TX (US); Jinqiao Xie, Allen, TX (US); Cathy Lee, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/414,289

(22) Filed: May 16, 2019

(51) Int. Cl.
| | |
|---|---|
| *H01L 29/66* | (2006.01) |
| *H01L 21/02* | (2006.01) |
| *H01L 29/778* | (2006.01) |

(52) U.S. Cl.
CPC .... *H01L 29/66462* (2013.01); *H01L 21/0254* (2013.01); *H01L 21/02378* (2013.01); *H01L 21/02458* (2013.01); *H01L 21/02639* (2013.01); *H01L 29/7783* (2013.01)

(58) Field of Classification Search
None
See application file for complete search history.

(56) References Cited

U.S. PATENT DOCUMENTS

| | | |
|---|---|---|
| 5,937,011 A | 8/1999 | Carney et al. |
| 2014/0159119 A1* | 6/2014 | Derluyn ............ H01L 29/66462 257/194 |
| 2015/0372081 A1 | 12/2015 | Lee et al. |

OTHER PUBLICATIONS

Eid, E.E., et al., "Adaptive Nulling Loop Control for 1.7-GHz Feedforward Linearization Systems," IEEE Transactions on Microwave Theory and Techniques, vol. 45, Issue 1, Jan. 1997, pp. 83-86.
Lee, Dong, Seup, et al., "Nanowire Channel InAlN/GaN HEMTs With High Linearity of gm and fT," IEEE Electron Device Letters, vol. 34, Issue 8, Aug. 2013, pp. 969-971.
Perraud, Laurent, et al., "A Direct-Conversion CMOS Transceiver for the 802.11a/b/g WLAN Standard Utilizing a Cartesian Feedback Transmitter", IEEE Journal of Solid-State Circuits, vol. 39, Issue 12, Dec. 2004, pp. 2226-2238.
Romanczyk, B., et al., "W-Band N-Polar GaN MISHEMTs with High Power and Record 27.8% Efficiency at 94 GHz," Electron Devices Meeting, Dec. 2016, San Francisco, California, IEEE, 4 pages.

* cited by examiner

*Primary Examiner* — Thien F Tran
(74) *Attorney, Agent, or Firm* — Withrow & Terranova, P.L.L.C.

(57) ABSTRACT

Fabricating high efficiency, high linearity N-polar gallium-nitride (GaN) transistors by selective area regrowth is disclosed. A demand for high efficiency components with highly linear performance characteristics for radio frequency (RF) systems has increased development of GaN transistors and, in particular, aluminum-gallium-nitride (AlGaN)/GaN high electron mobility transistor (HEMT) devices. A method of fabricating a high efficiency, high linearity N-polar HEMT device includes employing a selective area regrowth method for forming a HEMT structure on the Nitrogen-face (N-face) of a GaN buffer, a natural high composition AlGaN/AlN back barrier for carrier confinement, a thick undoped GaN layer on the access areas to eliminate surface dispersion, and a high access area width to channel width ratio for improved linearity. A problem of impurities on the GaN buffer surface prior to regrowth creating a leakage path is avoided by intentional silicon (Si) doping in the HEMT structure.

13 Claims, 17 Drawing Sheets

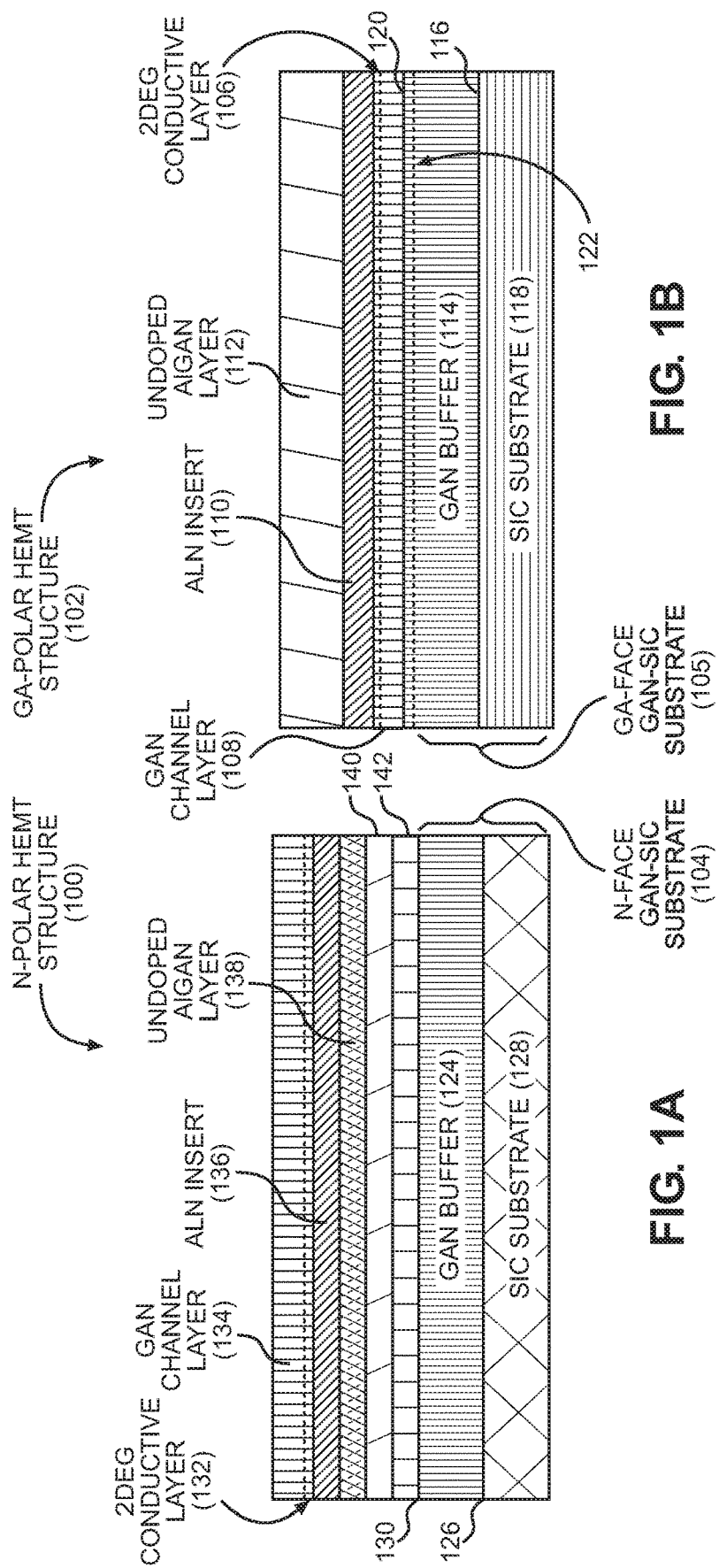

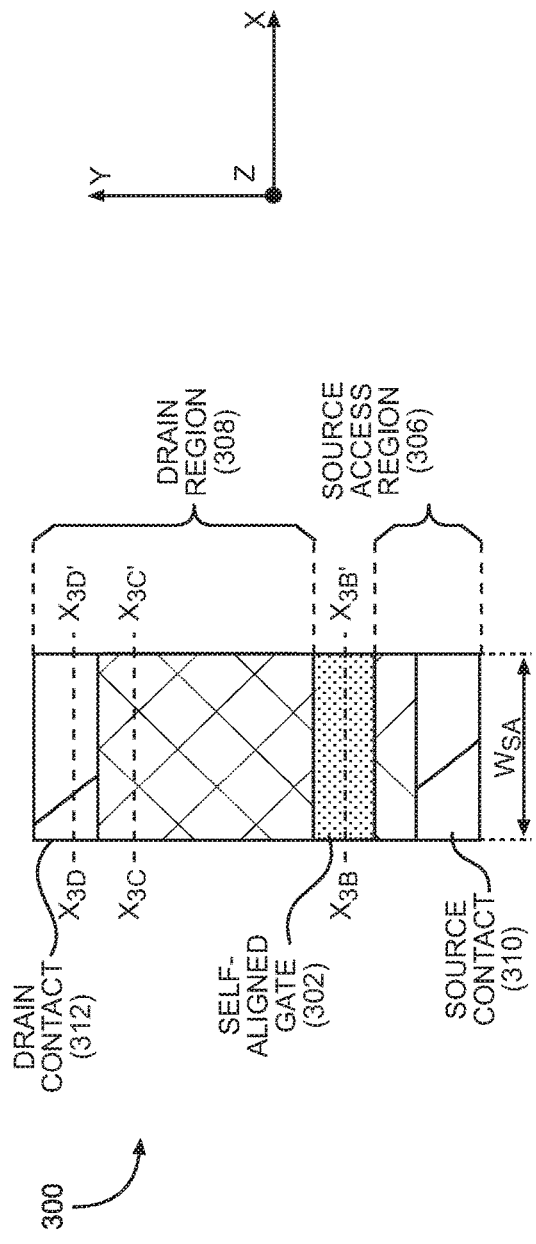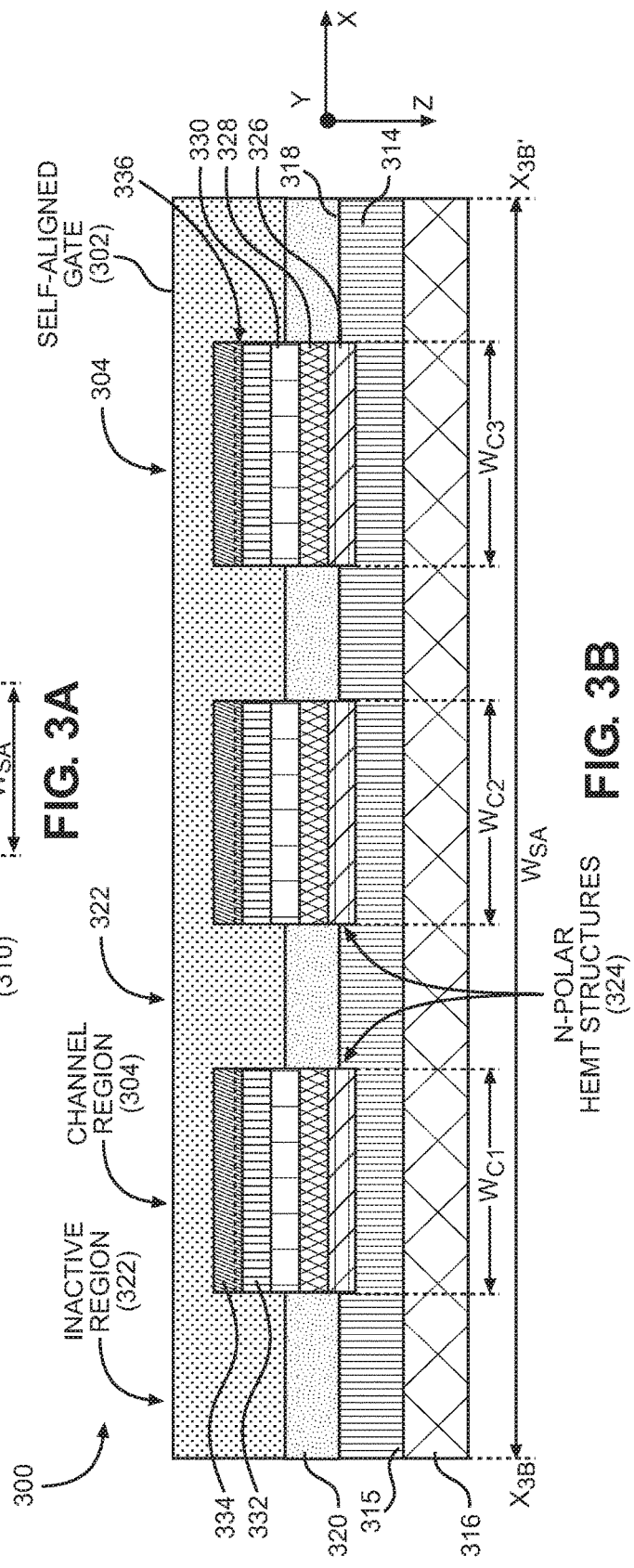
FIG. 3A
FIG. 3B

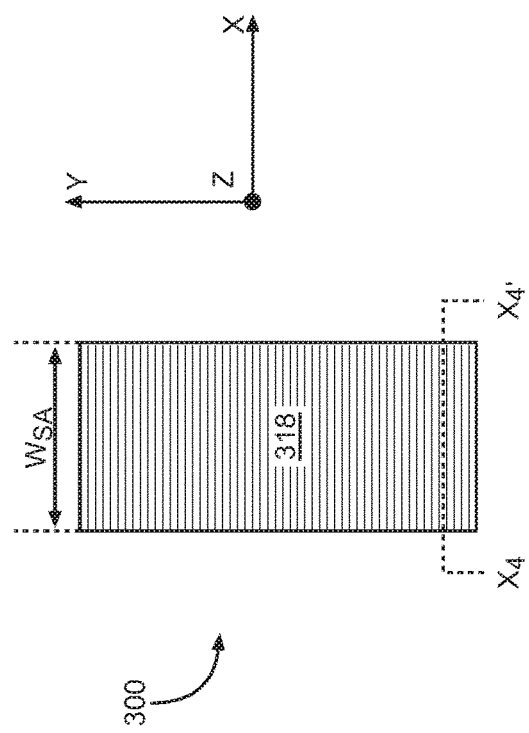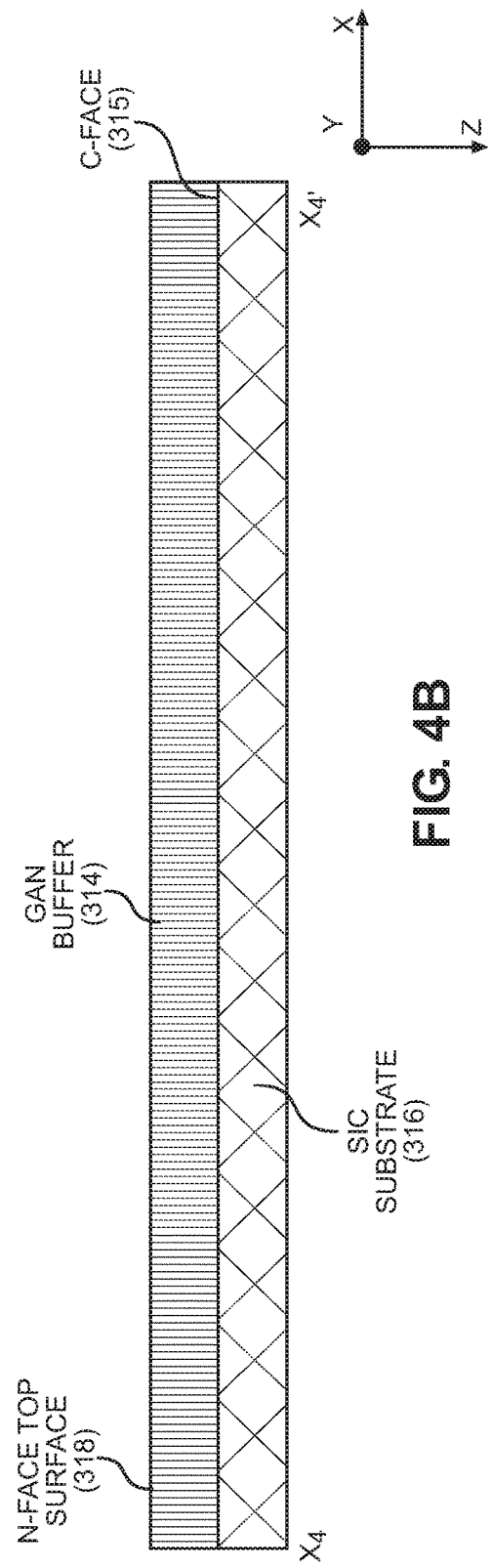

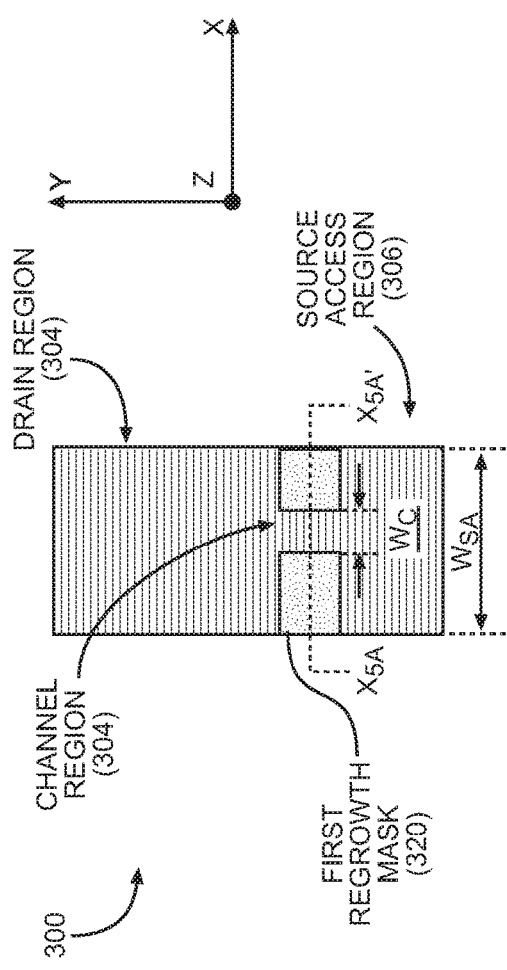
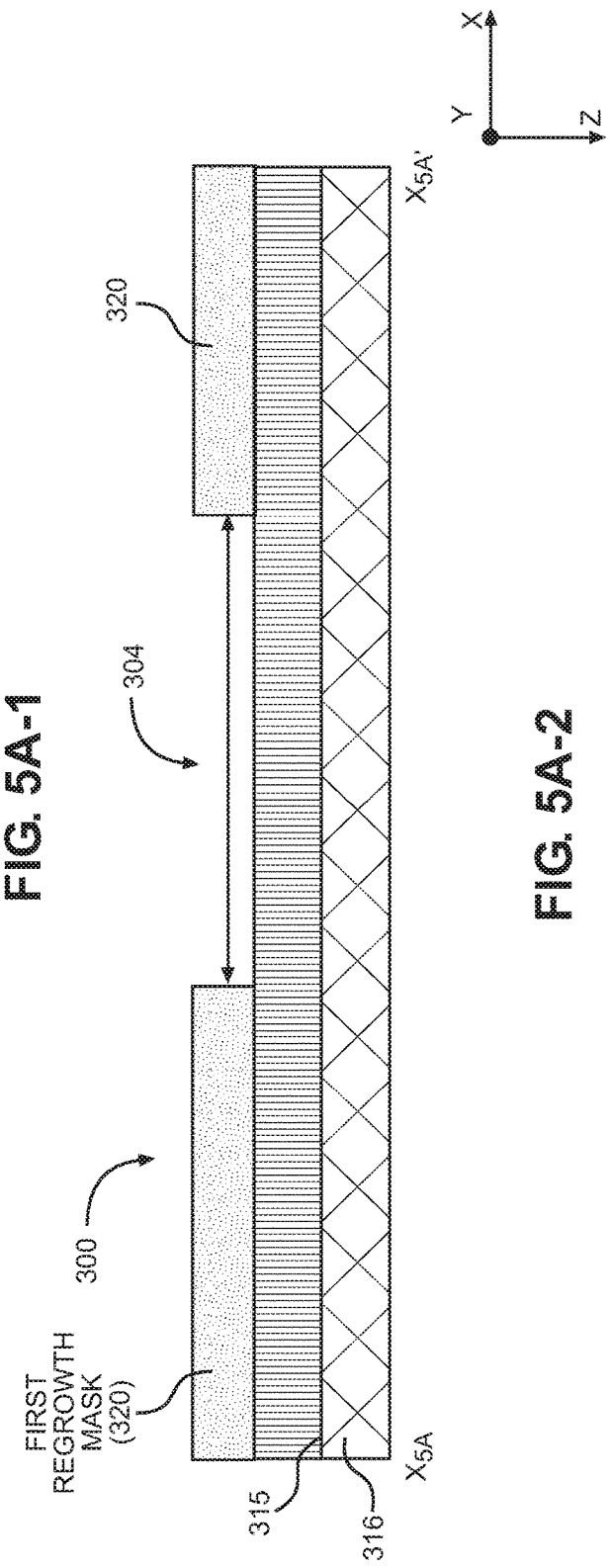
FIG. 5A-1
FIG. 5A-2

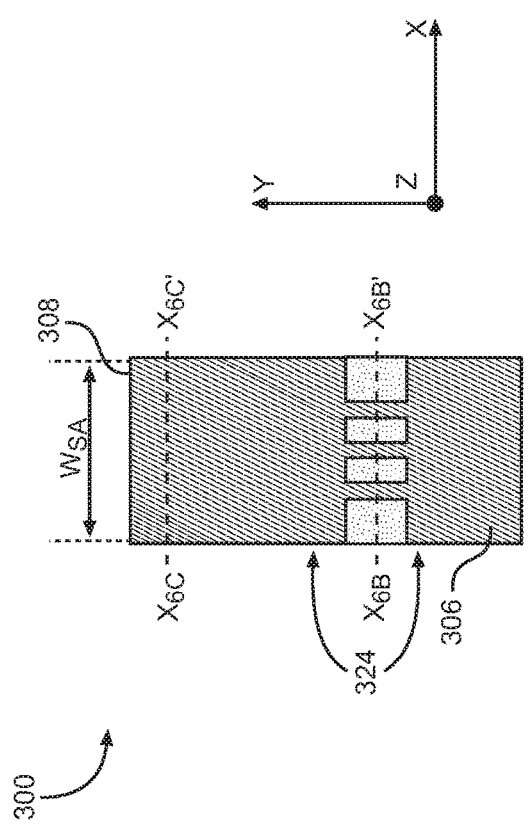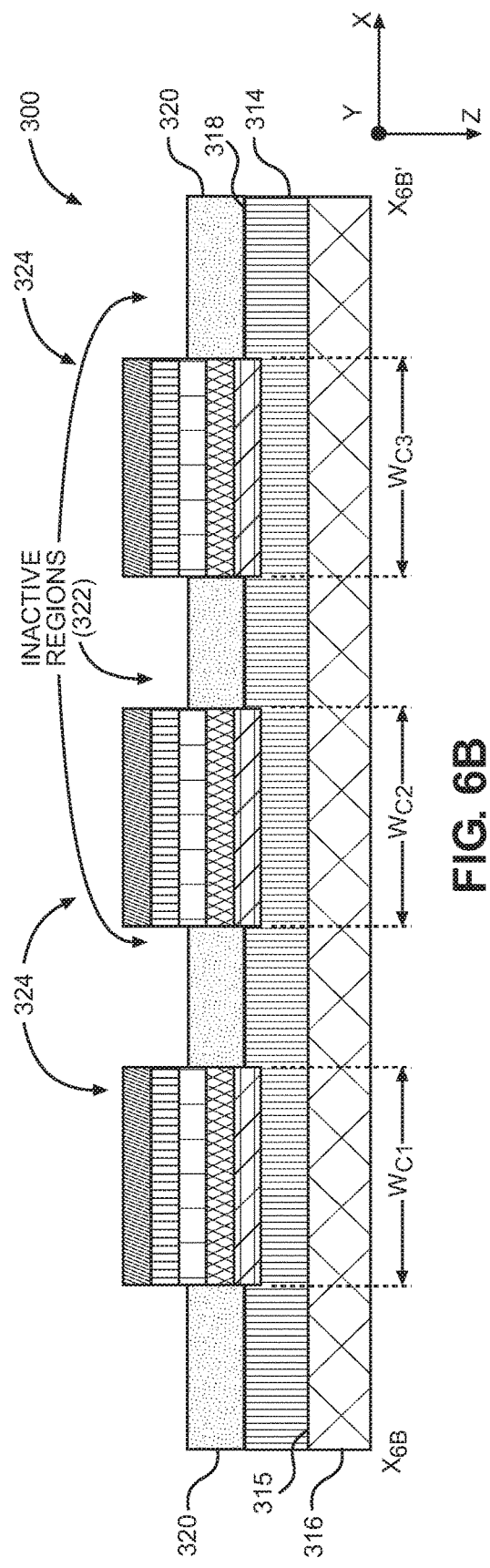
FIG. 6A
FIG. 6B

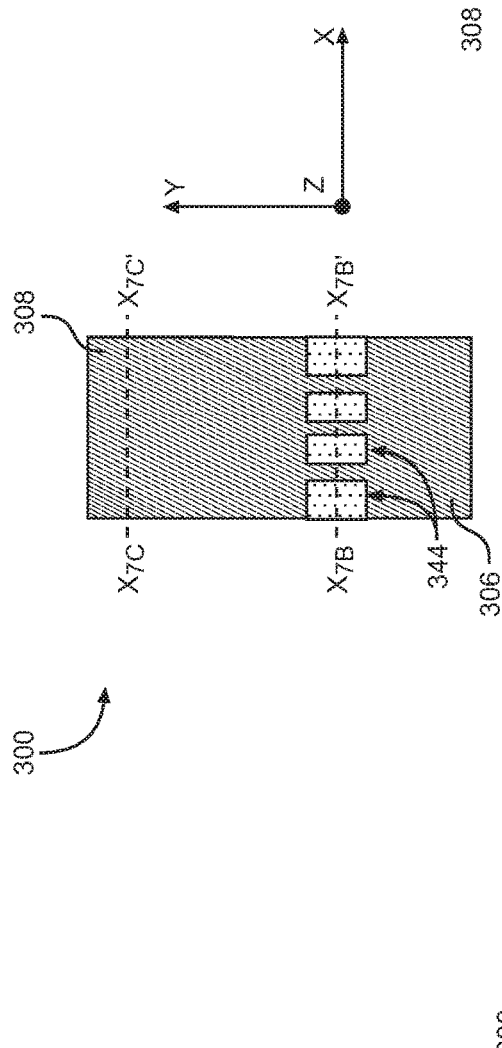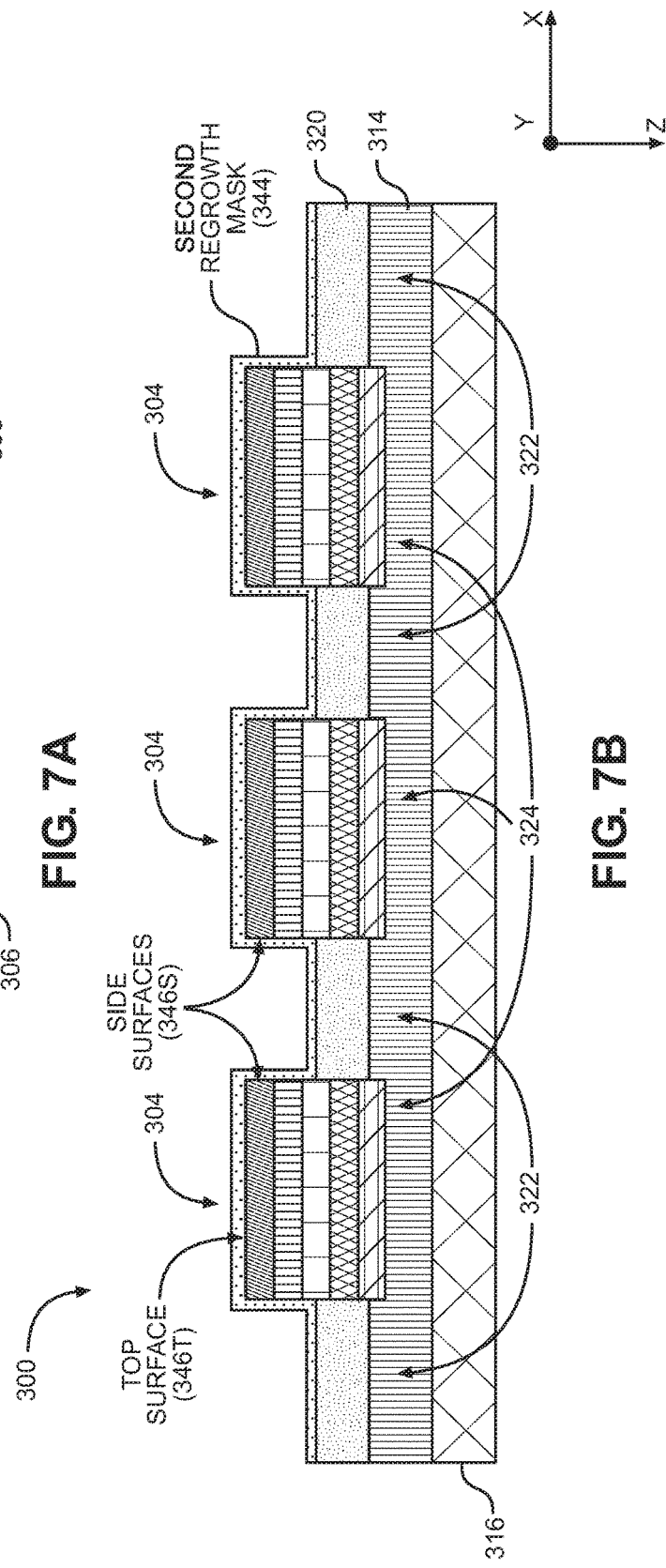

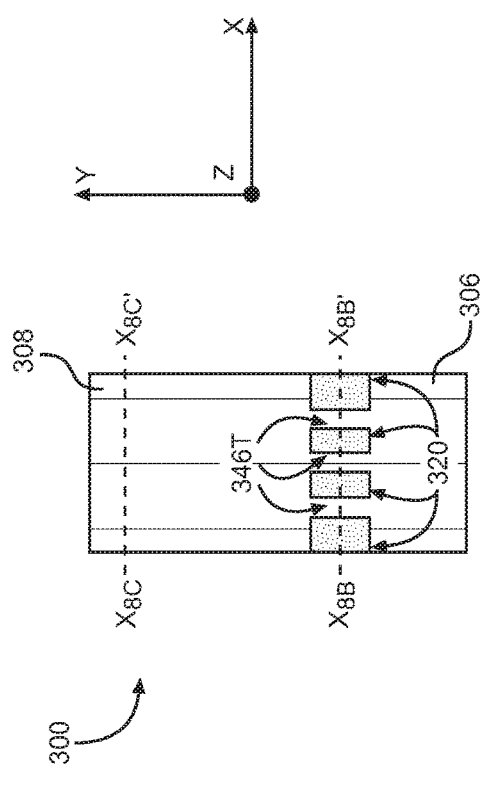
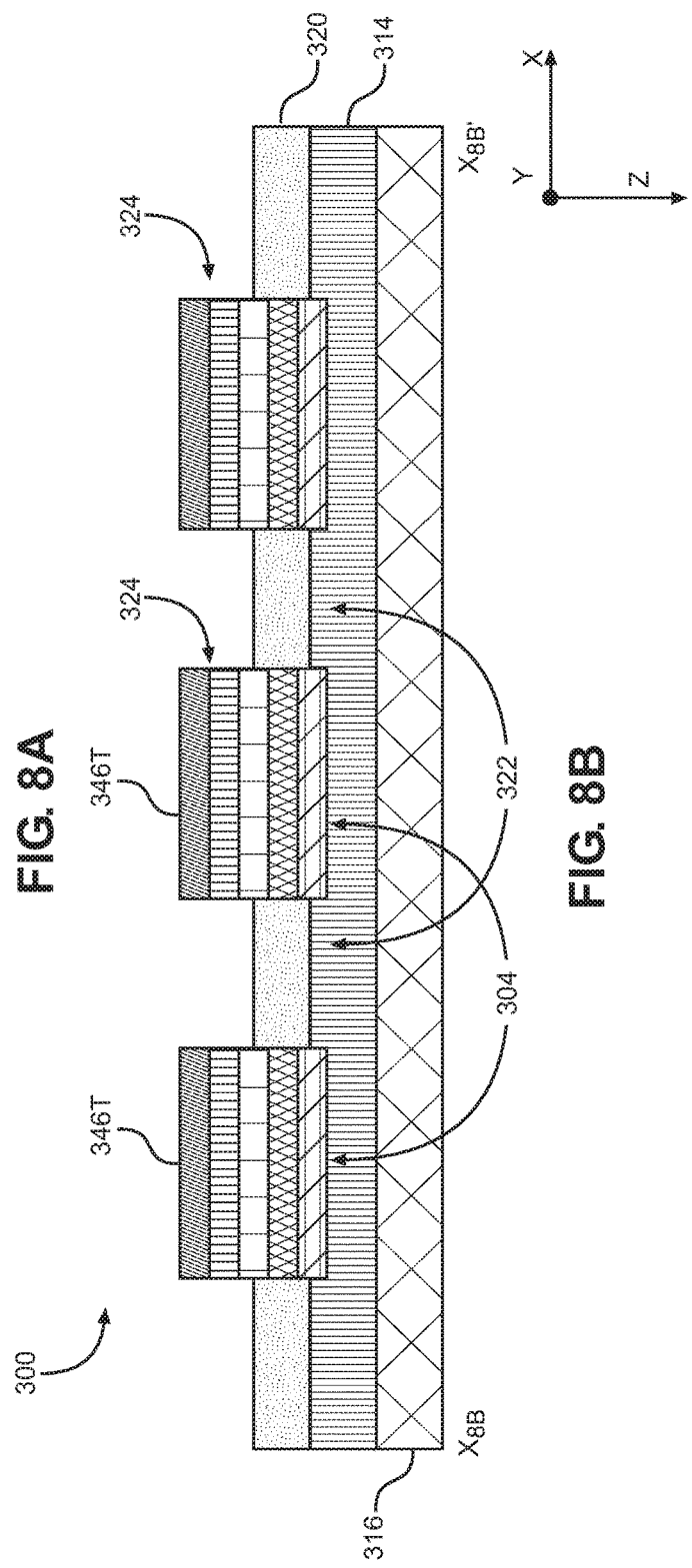
FIG. 8A
FIG. 8B

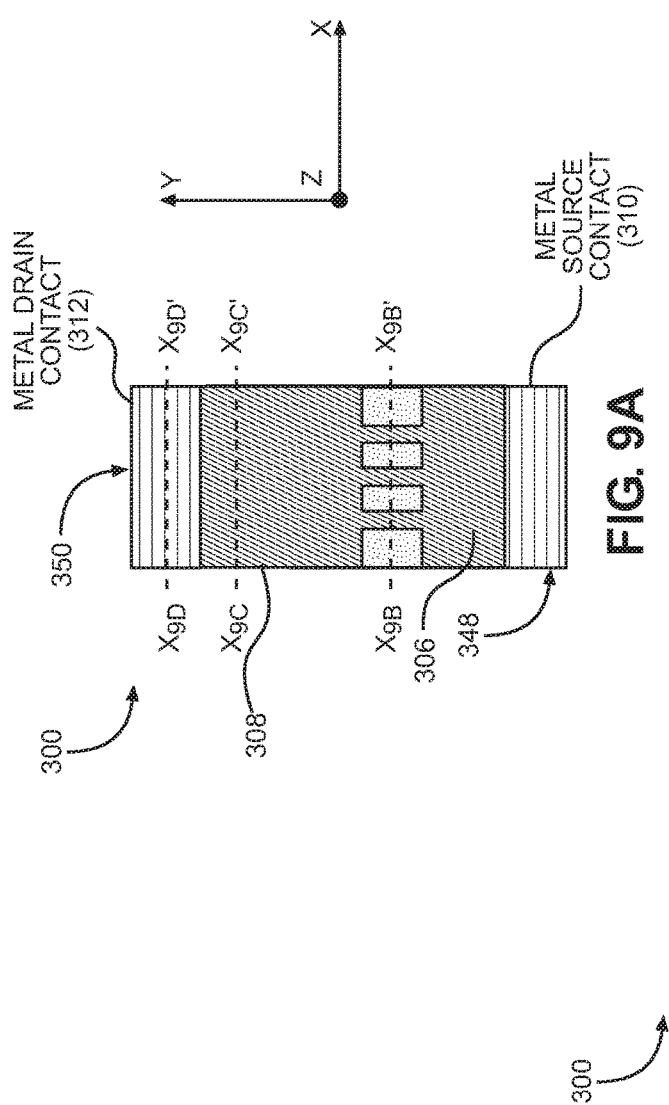
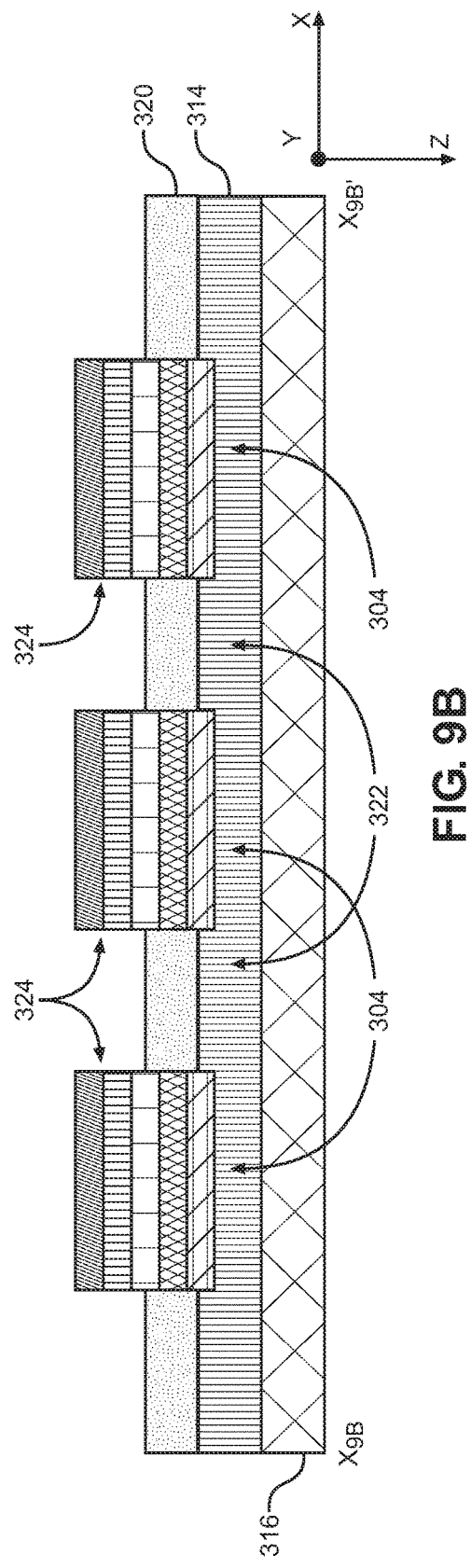
FIG. 9A
FIG. 9B

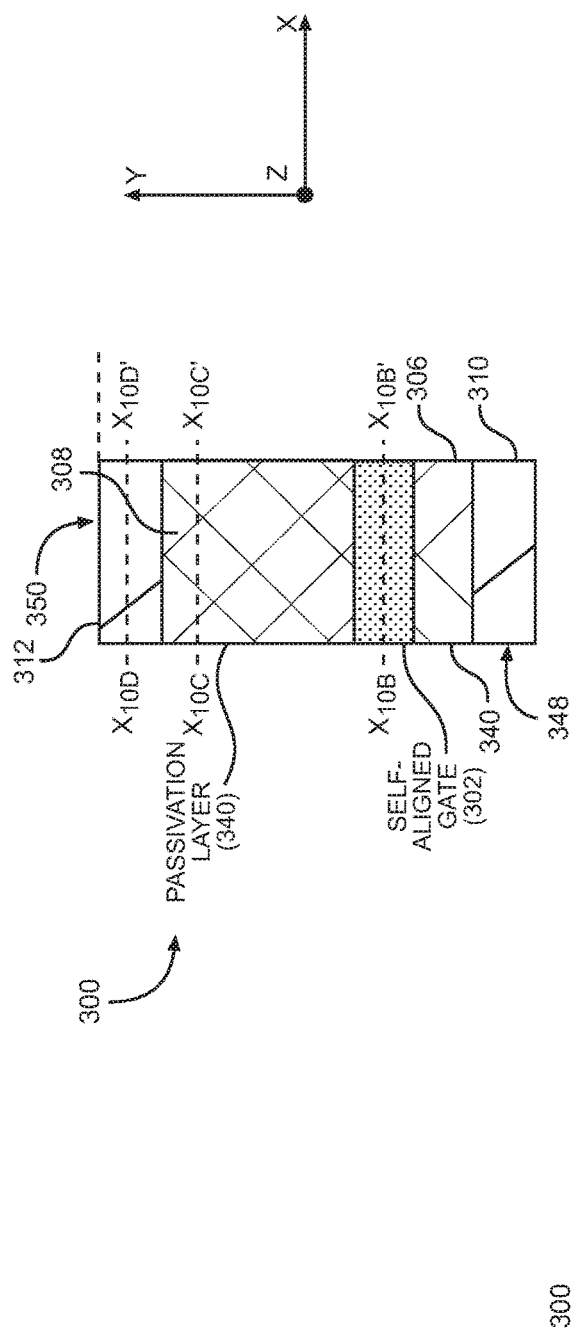
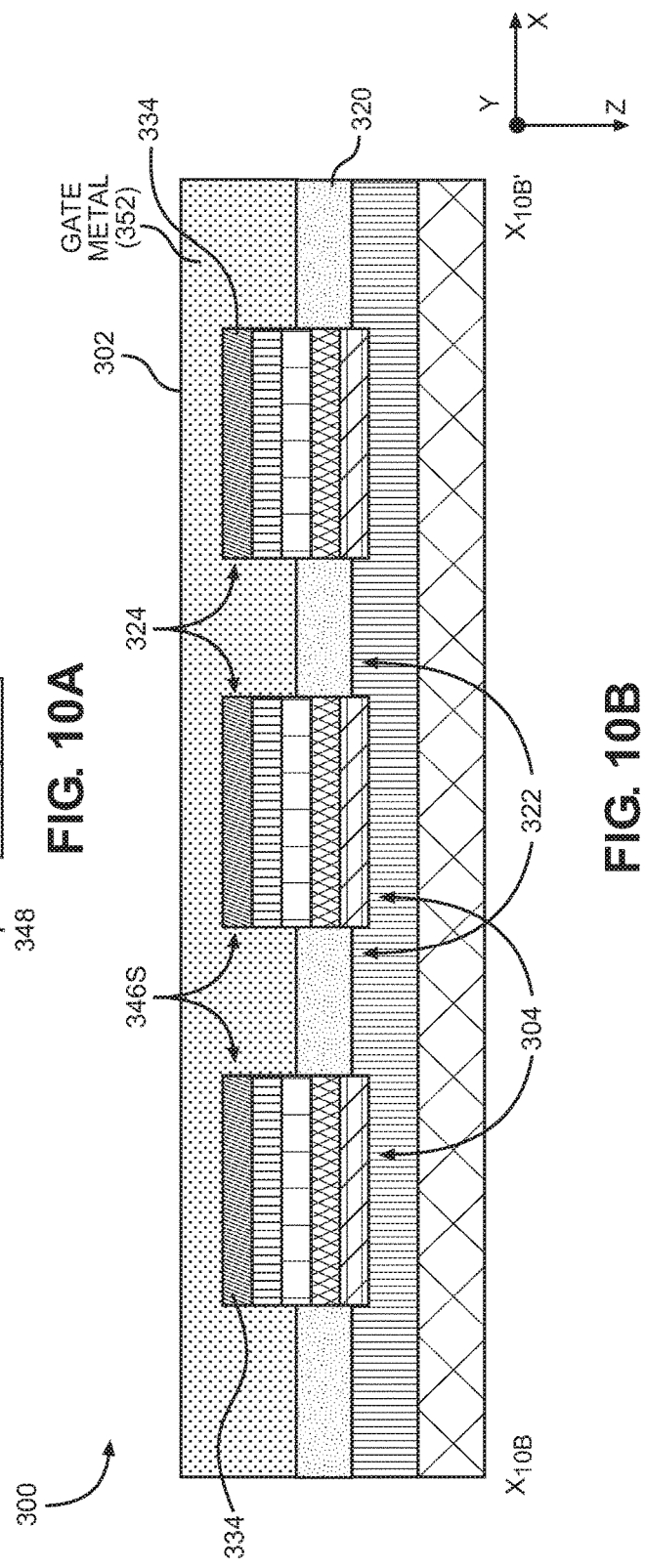
FIG. 10A
FIG. 10B

PROCESS OF FABRICATING HIGH EFFICIENCY, HIGH LINEARITY N-POLAR GALLIUM-NITRIDE (GAN) TRANSISTORS

FIELD OF THE DISCLOSURE

The present disclosure relates generally to fabricating semiconductor devices and, more particularly, to a process of fabricating gallium-nitride (GaN) transistors.

BACKGROUND

The market demand for smaller and more powerful electronics continues to fuel development of semiconductor devices that make such electronics possible. Efforts to maintain performance levels of semiconductor devices constantly face new challenges as device geometries get smaller. Technologies for which higher device performance is required can conflict with scaling efforts. Silicon-based semiconductor devices have been widely developed, but silicon-based technologies have reached physical limits that make it necessary to explore alternatives to meet demands for size and performance. Gallium-arsenide (GaAs)- and gallium-nitride (GaN)-based semiconductor devices, which have been less widely used than silicon-based devices, can reach smaller geometries without the problems seen in semiconductor devices. In addition, GaAs and GaN devices are capable of switching at higher speeds and conducting higher levels of current. However, GaAs and GaN device development has also encountered obstacles in both design and fabrication with regard to meeting performance objectives at smaller geometries, so new fabrication processes are needed.

SUMMARY

Fabricating high efficiency, high linearity N-polar gallium-nitride (GaN) transistors by selective area regrowth is disclosed. A demand for high efficiency components with highly linear performance characteristics for radio frequency (RF) systems has increased development of GaN transistors and, in particular, aluminum-gallium-nitride (AlGaN)/GaN high electron mobility transistor (HEMT) devices. Existing processes for fabricating HEMT devices with features that are critical to highly linear performance have been hampered by the creation of surface dispersion problems and leakage paths that limit device efficiency. A method of fabricating a high efficiency, high linearity N-polar HEMT device includes employing a selective area regrowth method for forming a HEMT structure on the Nitrogen-face (N-face) of a GaN buffer, a natural high composition AlGaN/AlN back barrier for carrier confinement, a thick undoped GaN layer on the access areas to eliminate surface dispersion, and a high access area width to channel width ratio for improved linearity. A problem of impurities on the GaN buffer surface prior to regrowth creating a leakage path is avoided by intentional silicon (Si) doping in the HEMT structure.

In one aspect, a method of fabricating a semiconductor device is disclosed. The method includes forming a GaN buffer on a silicon-carbide (SiC) substrate, forming a first regrowth mask including a source access region, a drain region, and at least one channel region of the GaN buffer. The method further includes forming a HEMT structure on the GaN buffer in the source access region, the drain region, and the at least one channel region and forming an undoped GaN layer over the HEMT structure in the source access region and the drain region. The method further includes forming a metal source contact on the undoped GaN layer in the source access region and a metal drain contact on the drain region. The method further includes forming a self-aligned gate over the at least one channel region.

In another aspect, a transistor device is disclosed. The transistor device includes a GaN buffer formed on a Carbon-face (C-face) of a SiC substrate. The transistor device also includes a HEMT structure on an (N-face) of the GaN buffer. The HEMT structure includes a source access region having a first width. The HEMT structure also includes a drain region. The HEMT structure also includes a plurality of channel regions isolated from each other and each providing a controlled conduction channel extending between the source access region and the drain region. The transistor device also includes an undoped GaN layer on the HEMT structure in the source access region and the drain region. The transistor device also includes a gate extending over the plurality of channel regions to control conduction in the plurality of channel regions. The transistor device also includes a source contact coupled to the source access region and a drain contact coupled to the drain region.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIGS. 1A and 1B are cross-sectional side views of an N-polar aluminum-gallium-nitride (AlGaN)/gallium-nitride (GaN) high electron mobility transistor (HEMT) (N-polar HEMT) structure, and a Ga-polar AlGaN/GaN HEMT (Ga-polar HEMT) structure, respectively;

FIGS. 3A-3D are a top view, and first through third cross-sectional side views, respectively, of a high efficiency, high linearity N-polar HEMT device formed according to the process in FIG. 2;

FIGS. 4A and 4B are a top view and a cross-sectional side view, respectively, of an N-face of a GaN buffer formed on a Carbon-face (C-face) of a silicon-carbide (SiC) substrate in a fabrication stage of the process illustrated in FIG. 2;

FIGS. 5A-1 and 5A-2 are a top view and a cross-sectional side view, respectively, of the SiC substrate in FIGS. 4A and 4B with a first regrowth mask formed to include a source access region, a drain region, and a single channel region in a first example of a fabrication stage of the process illustrated in FIG. 2;

FIGS. 5B-1 and 5B-2 are a top view and a cross-sectional side view, respectively, of the SiC substrate in FIGS. 4A and 4B with a first regrowth mask formed to include a source access region, a drain region, and a plurality of channel regions in a second example of a fabrication stage of the process illustrated in FIG. 2;

FIGS. 6A-6C are a top view, a first cross-sectional side view, and a second cross-sectional side view, respectively, of the substrate in FIGS. 5A-1-5B-2 on which a HEMT structure is formed on regions of the GaN buffer exposed by patterning the first regrowth mask in a fabrication stage of the process illustrated in FIG. 2;

FIGS. 7A-7C are a top view, a first cross-sectional side view, and a second cross-sectional side view, respectively, of the substrate in FIGS. 6A-6C in which a second regrowth mask is formed over the first regrowth mask and over the at least one channel region in a fabrication stage of the process illustrated in FIG. 2;

FIGS. 8A-8C are a top view, a first cross-sectional side view, and a second cross-sectional side view, respectively, of the substrate in FIGS. 7A-7C on which an undoped GaN layer is formed over the HEMT structure in the source access region and the drain region in a fabrication stage of the process illustrated in FIG. 2;

Figure 2:
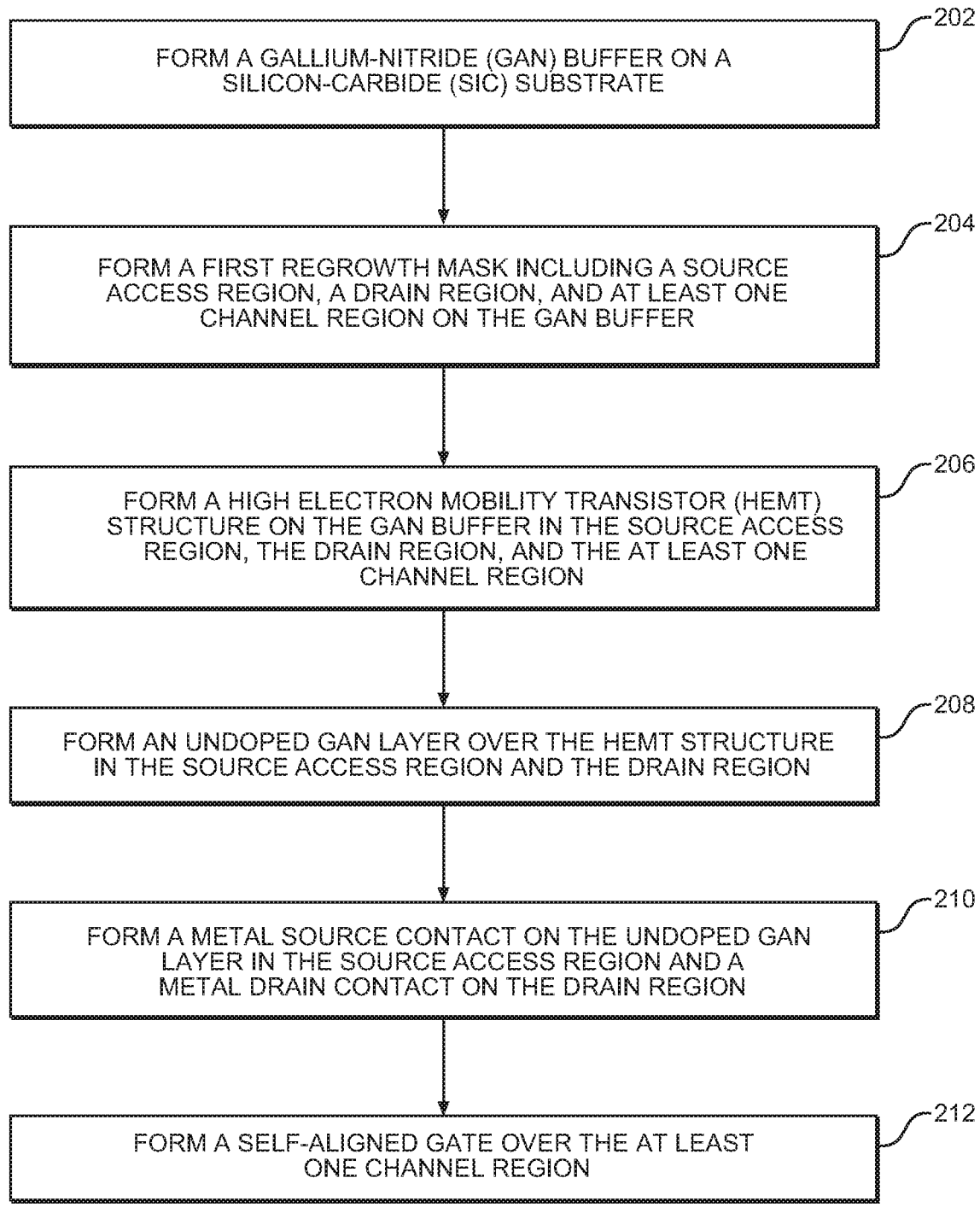
FIG. 2 is flowchart of a process of fabricating a high efficiency, high linearity N-polar HEMT device including forming an N-polar HEMT structure on a Nitrogen-face (N-face) of a GaN buffer.
Figure 8C:
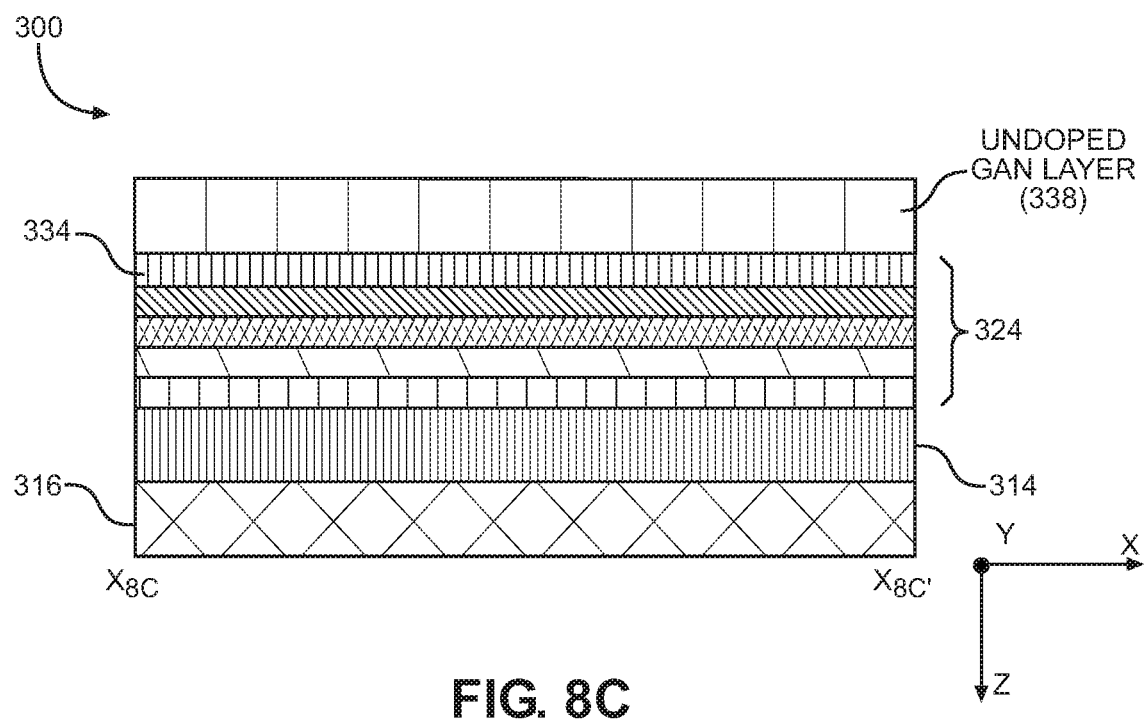

FIGS. 9A-9D are a top view, and first through third cross-sectional side views, respectively, of the substrate in FIGS. 8A-8C on which metal contacts are formed by ohmic growth on the source access region and the drain region in a fabrication stage of the process illustrated in FIG. 2; and FIGS. 10A-10D are a top view, and first through third cross-sectional side views, respectively, of the substrate in FIGS. 9A-9D in which a second regrowth mask is formed over the first regrowth mask and over the at least one channel region in a fabrication stage of the process illustrated in FIG. 2.

DETAILED DESCRIPTION

Those skilled in the art will appreciate the scope of the present disclosure and realize additional aspects thereof after reading the following detailed description of the preferred embodiments in association with the accompanying drawing figures.

Fabricating high efficiency, high linearity N-polar gallium-nitride (GaN) transistors by selective area regrowth is disclosed. A demand for high efficiency components with highly linear performance characteristics for radio frequency (RF) systems has increased development of GaN transistors and, in particular, aluminum-gallium-nitride (AlGaN)/GaN high electron mobility transistor (HEMT) devices. Existing processes for fabricating HEMT devices with features that are critical to highly linear performance have been hampered by the creation of surface dispersion problems and leakage paths that limit device efficiency. A method of fabricating a high efficiency, high linearity N-polar HEMT device includes employing a selective area regrowth method for forming a HEMT structure on the Nitrogen-face (N-face) of a GaN buffer, a natural high composition AlGaN/AlN back barrier for carrier confinement, a thick undoped GaN layer on the access areas to eliminate surface dispersion, and a high access area width to channel width ratio for improved linearity. A problem of impurities on the GaN buffer surface prior to regrowth creating a leakage path is avoided by silicon (Si) doping in the HEMT structure.

FIGS. 1A and 1B are cross-sectional side views of an N-polar AlGaN/GaN HEMT (N-polar HEMT) structure 100 and a Ga-polar AlGaN/GaN HEMT (Ga-polar HEMT) structure 102, respectively. In both types of HEMT structures, a HEMT structure is formed on a GaN-silicon-carbide (SiC) substrate. The example in FIG. 1A includes an N-face GaN-SIC substrate 104, and the example in FIG. 1B includes a Gallium-face (Ga-face) GaN-SIC substrate 105. In the Ga-face GaN-SIC substrate 105, a two-dimensional electron gas (2DEG) conductive layer 106 is formed at the interface of a GaN channel layer 108 and a thin aluminum-nitride (AlN) insert 110 between the GaN channel layer 108 and an undoped AlGaN layer 112. In the N-face GaN-SIC substrate 104 a 2DEG conductive layer 132 is formed at the interface of a GaN channel layer 134 and a thin AlN insert 136 between the GaN channel layer 134 and an undoped AlGaN layer 138. GaN devices (e.g., transistors) can be formed from the N-polar HEMT structure 100 and the Ga-polar HEMT structure 102 by adding contacts to each end of a top surface and forming a gate over a channel region extending between the contacts. The channel region may be in a planar region or in a fin structure, as shown below.

The Ga-face GaN-SiC substrate 105 of the Ga-polar HEMT structure 102 in FIG. 1B includes a GaN buffer 114 formed on the Si-face 116 of a SiC substrate 118, such that the top surface 120 of the GaN crystalline structure of the GaN buffer 114 is formed of gallium (Ga-face). The Ga-polar HEMT structure 102 includes the GaN channel layer 108 formed on the Ga-face/top surface 120 of the GaN buffer 114, the AlN insert 110 formed on the GaN channel layer 108, and the undoped AlGaN layer 112 formed on the AlN insert 110. The layers of the Ga-polar HEMT structure 102 are formed by regrowth on the Ga-face GaN-SiC substrate 105. In one method, the GaN channel layer 108, the AlN insert 110, and the undoped AlGaN layer 112 cover the top surface 120 of the GaN buffer 114 in a blanket regrowth process to form the layered Ga-polar HEMT structure 102 in FIG. 1B. A dry etch process may be employed to form features of a Ga-polar HEMT device (Ga-polar device), by removing material from the layered Ga-polar HEMT structure 102. The feature surfaces created by the dry etching have increased surface defects due to irregularities and include point defects and contamination, which can cause a reduction in device efficiency due to increased surface dispersion.

An alternative approach to dry etching is a selective regrowth process in which, rather than covering the entire top surface 120 of the GaN buffer 114 in a blanket process, the features of a Ga-polar device may be selectively grown, layer by layer. However, the top surface 120 of the GaN buffer 114 is exposed to impurities in the regrowth process and may become lightly doped with silicon (Si) and oxygen (O), which may cause formation of a leakage path 122 parallel to the 2DEG conductive layer 106. Leakage current flowing in the leakage path 122 reduces efficiency and can prevent the device from fully turning off.

The N-polar HEMT structure 100 in FIG. 1A is based on a GaN buffer 124 formed on a carbon face (C-face) 126 of an SiC substrate 128, so the N-polar HEMT structure 100 is formed on an N-face top surface 130 of the crystalline structure of the GaN buffer 124. In the N-polar HEMT structure 100, the layers forming a 2DEG conductive layer 132 are inverted with respect to the Ga-polar HEMT structure 102 in FIG. 1B. In the N-polar HEMT structure 100, the top layer is a GaN channel layer 134. Between the GaN channel layer 134 layer and an undoped AlGaN layer 138 is an AlN insert 136. Together, these layers form the 2DEG conductive layer 132. Although the GaN buffer 124 is also subject to impurities in the top surface 130, like the top surface 120 of the Ga-polar HEMT structure 102, a worse leakage path problem would be created in the N-polar HEMT structure 100 if two additional transition layers were not included. Immediately below the undoped AlGaN layer 138 is an AlGaN layer 140 that is Si doped, and between the Si-doped AlGaN layer 140 and the GaN buffer 124 is a Si-doped GaN layer 142. In the absence of the AlGaN layer 140 and the Si-doped GaN layer 142, a 2DEG type of layer would be created between the undoped AlGaN layer 138 and the GaN buffer 124. The polarization field caused by the AlGaN layer 140 and the Si-doped GaN layer 142 allows a transition from AlGaN to GaN without creating the 2DEG layer, and the impurities in the GaN buffer 124 become inconsequential.

Forming an N-polar GaN device from a HEMT structure using subtractive etching methods suffers from the problems discussed above regarding Ga-polar devices. Damage to feature surfaces caused by dry etching can increase surface dispersion, which reduces device efficiency. This problem increases with the amount of surface area of the structures in an N-polar HEMT device (N-polar device). In a device having a single channel in a single fin structure, the loss of efficiency due to damage to the fin surfaces may be manageable. However, it has been found that side-wall channels in AlGaN/GaN Fin Field-Effect Transistors (FETs) (Fin-FETs) contribute to the total device performance, along with the 2DEG channel current. Thus, to design an N-polar device having much higher linearity, a plurality of narrower fins may be preferable. An increase in the number of fins significantly increases the total surface area of channel regions and significantly increases the susceptibility of the device to surface dispersion caused by dry etch damage to the surfaces of the fins. Thus, another approach is needed.

Figure 3C:
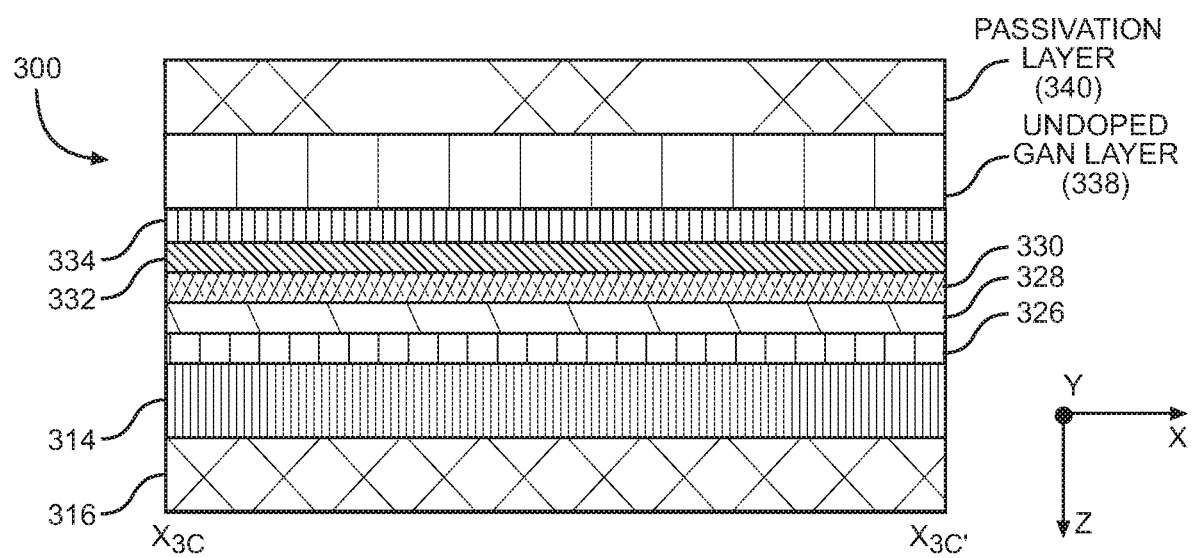
Figure 3D:
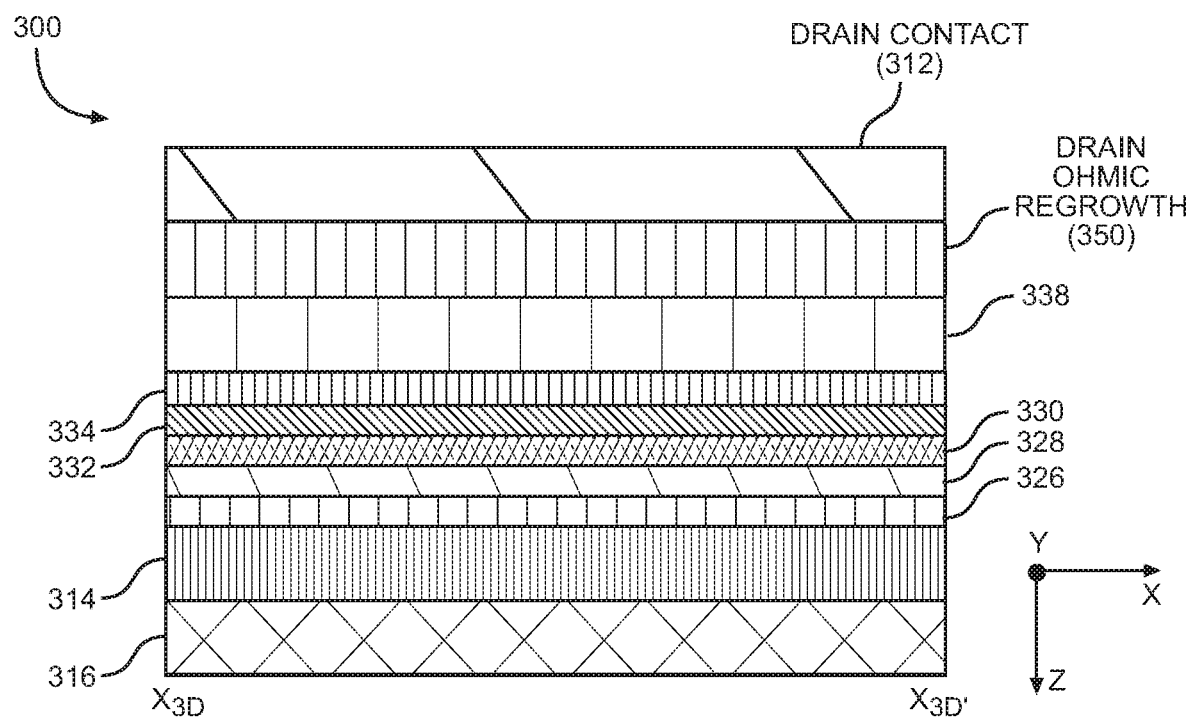

FIG. 2 is a flowchart of a process of fabricating a high efficiency, high linearity N-polar GaN device as shown in FIGS. 3A-3D. The process in FIG. 2 is explained with reference to the fabrication stages illustrated in FIGS. 4A-4B to 9A-9D. First, FIG. 3A is a top view and FIGS. 3B-3D are first, second, and third cross-sectional views, respectively of a GaN device 300 formed by the process in FIG. 2. A self-aligned gate 302 is disposed over channel regions 304 of the GaN device 300 in FIGS. 3A and 3B between a source access region 306 and a drain region 308. The GaN device 300 includes a metal source contact 310 disposed on the source access region 306 and a metal drain contact 312 disposed on the drain region 308.

FIG. 3B is a first cross-sectional side view $X_{3B}$-$X_{3B}'$ in the channel regions 304 of the GaN device 300, including a GaN buffer 314 formed on a C-face 315 of SiC substrate 316. On the N-face top surface 318, a first regrowth mask 320 (e.g., a SiN layer) is disposed in inactive regions 322 between channel regions 304. Each of the channel regions 304 includes the layers of an N-polar HEMT structure 324 as discussed above. In particular, a doped GaN layer 326 doped with Si (e.g., 7e18 doped) is disposed on the N-face of the GaN buffer 314 in each of the channel regions 304. The doping of the doped GaN layer 326 is a higher level of doping than the unintended doping due to impurities in the N-face top surface 318 of the GaN buffer 314. Such doping can compensate for the polarization field induced 2DHG layer, and therefore it effectively eliminates the formation of a parallel leakage path in the N-face top surface 318. Moreover, it can also improve the current collapse which is caused by such 2DEG layer. The doped GaN layer 326 in the example in FIG. 3B may be disposed to have a thickness of 150 angstroms (Å). An AlGaN layer 328 doped with Si (e.g., 7e18 doped) is disposed on the GaN layer 326. The AlGaN layer 328 may be disposed to have a thickness of approximately 100 Å in the example. Each of the channel regions 304 further includes an undoped AlGaN layer 330, which is disposed to a thickness of approximately 100 Å on the AlGaN layer 328. An AlN layer 332, having a thickness of approximately 10 Å in the example in FIG. 3B, is disposed on the AlGaN layer 330, and a GaN channel layer 334 is disposed on the AlN layer 332 and has a thickness of approximately 180 Å in the example in FIG. 3B. A 2DEG conduction channel 336 may be formed at the intersection of the GaN channel layer 334 and the AlN layer 332 in each of the channel regions 304. A direction of electron flow in each of the 2DEG conduction channels 336 is orthogonal to the illustration in FIG. 3B. The self-aligned gate 302 is disposed over the N-polar HEMT structures 324 in each of the channel regions 304.

In GaN HEMT devices, an increase of access resistance as drain current increases causes non-linear device performance. To improve performance linearity of the GaN device 300, a total width $W_{CTTL}$ of the channel regions 304 is made smaller than a width $W_{SA}$ of the source access region 306 and the drain region 308. The total width $W_{CTTL}$ is a total of widths $W_{C1}$, $W_{C2}$, and $W_{C3}$ of the channel regions 304. Forming multiple narrower channel regions 304, rather than a single wider channel region 304, may provide improved carrier confinement for increased efficiency. Forming source and drain ohmic contacts by n+ regrowth minimizes contact resistance and further contributes to high efficiency.

FIG. 3C is a cross-sectional side view $X_{3C}$-$X_{3C}'$ of the GaN device 300 in the drain region 308. The cross-sectional side view $X_{3C}$-$X_{3C}'$ in the drain region 308 corresponds to a cross-sectional side view of the source access region 306. As shown in FIG. 3C, the drain region 308 includes all the layers (326, 328, 330, 332, and 334) of the channel regions 304. An undoped GaN layer 338 is disposed over the GaN channel layer 334 in the drain region 308 and the source access region 306 to provide isolation from surface charges. Thus, the undoped GaN layer 338 reduces surface dispersion in the channel regions 304, which increases efficiency of the GaN device 300. The undoped GaN layer 338 in the example of FIG. 3C is disposed at a thickness of approximately 500 Å. A passivation layer 340 is disposed over the undoped GaN layer 338 in the drain region 308 and the source access region 306.

FIG. 3D is a cross-sectional side view $X_{3D}$-$X_{3D}'$ of the GaN device 300 in the drain region 308 where the metal drain contact 312 is formed. In the cross-sectional side view $X_{3D}$-$X_{3D}'$, the passivation layer 340 is not formed on the undoped GaN layer 338. Instead, to provide an ohmic contact (e.g., low resistance contact) between the undoped GaN layer 338 and the metal drain contact 312, a drain ohmic regrowth 350 with heavy n-type doping (n>1E20 cm$^{-3}$) is grown on the undoped GaN layer 338 in the drain region 308, and the metal drain contact 312 is formed as a metal layer on the drain ohmic regrowth 350. The metal source contact 310 is also an ohmic contact formed in the same manner as the metal drain contact 312 in the example in FIG. 3D.

The process in FIG. 2 for fabricating the GaN device 300 in FIGS. 3A-3D is discussed with reference to stages of fabrication illustrated in FIGS. 4A and 4B to FIGS. 10A-10D.

FIGS. 4A and 4B are a top view and a cross-sectional side view, respectively, of a fabrication stage in the process illustrated in FIG. 2 including forming a GaN buffer 314 on the C-face 315 of the SiC substrate 316 (block 202, FIG. 2). FIG. 4A is a top view looking in a Z-axis direction on the N-face top surface 318 of the GaN buffer 314 having a longitudinal axis in the Y-axis direction and a width $W_{SA}$ in the X-axis direction. The width $W_C$ of the channel region 304 is smaller than the width $W_{SA}$ for improved linearity. FIG. 4B is a side view in the Y-axis direction of a cross-section taken at line $X_4$-$X_4'$ and showing the GaN buffer 314 formed on the C-face 315 of the SiC substrate 316. Forming the GaN buffer 314 on the SiC substrate 316 may include forming an aluminum-nitride (AlN) nucleation layer (not shown) on the C-face 315 of the SiC substrate 316 and growing the GaN buffer 314 on the AlN nucleation layer.

Figures 1, 5B:
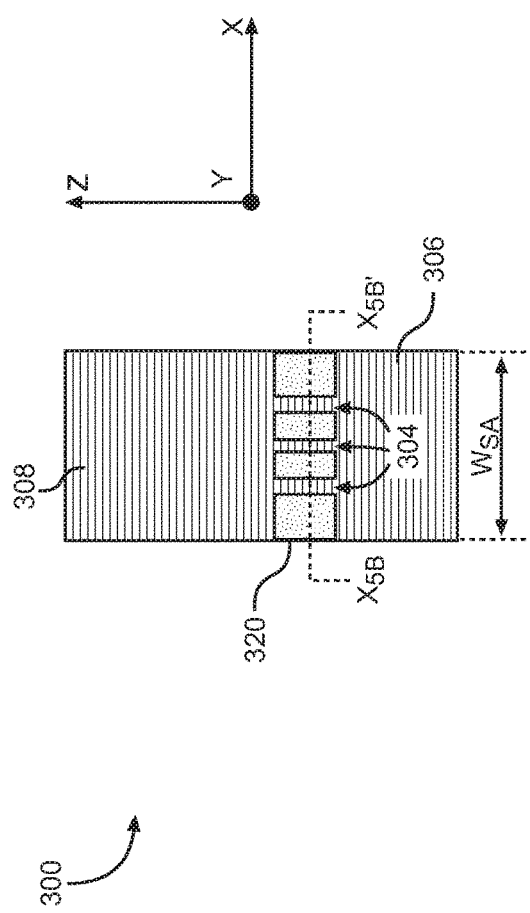
Figures 2, 5B:
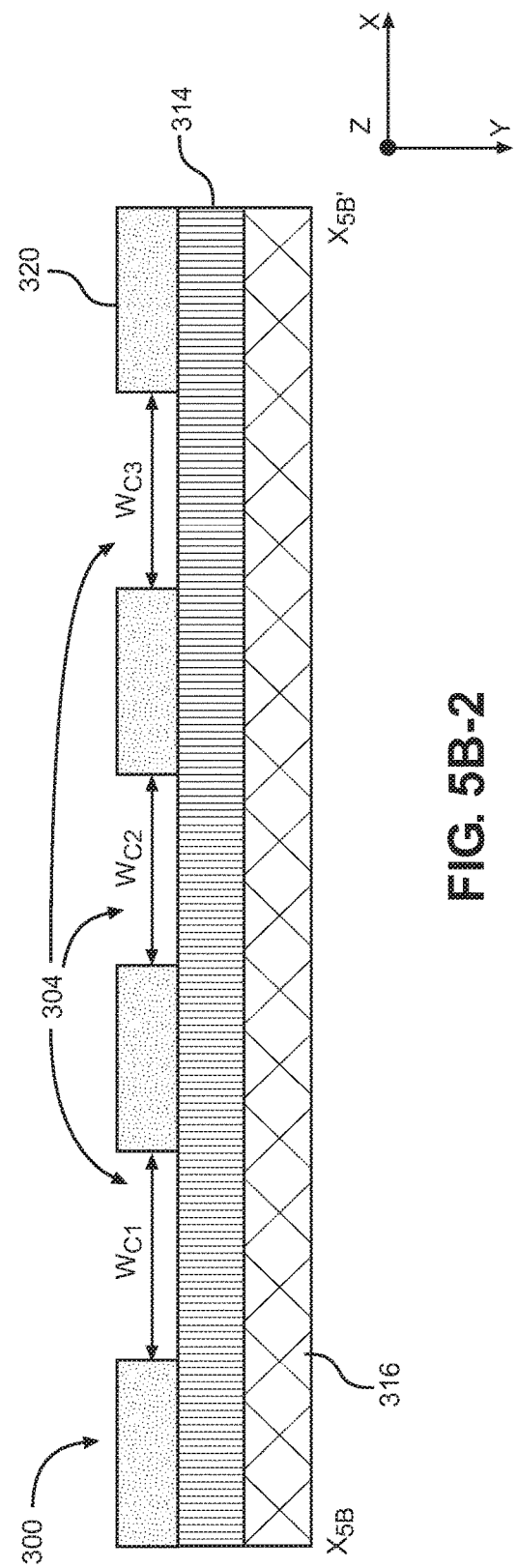

FIGS. 5A-1 and 5B-1 are top views and FIGS. 5A-2 and 5B-2 are cross-sectional side views of first and second examples, respectively, of a fabrication stage of the GaN device 300 in the process illustrated in FIG. 2 including forming a first regrowth mask 320 including a source access region 306, a drain region 308, and at least one channel region 304 on the GaN buffer 314 (block 204, FIG. 2). Forming the first regrowth mask 320 may include depositing the first regrowth mask 320 on the N-face top surface 318 of the GaN buffer 314 and patterning the first regrowth mask 320 to expose portions of the N-face top surface 318 in the source access region 306, the drain region 308, and the at least one channel region 304.

FIG. 5A-1 is a top view in the Z-axis direction of the first example of the fabrication stage in which the first regrowth mask 320 is patterned to expose the top surface 318 of the GaN buffer 314 in the source access region 306, the drain region 308, and a single channel region 304 extending in a Y-axis direction between the source access region 306 and the drain region 308. FIG. 5A-2 is a cross-sectional side view in the Y-axis direction taken at the line $X_{5A}$-$X_{5A}'$ in FIG. 5A-1 showing that the first regrowth mask 320 is patterned with an opening in the single channel region 304.

FIG. 5B-1 is a top view in the Z-axis direction of the second example of the fabrication stage in which the first regrowth mask 320 is patterned to expose the top surface 318 of the GaN buffer 314 in the source access region 306, the drain region 308, and at least one channel region 304 extending in a Y-axis direction between the source access region 306 and the drain region 308. FIG. 5B-2 is a cross-sectional side view in the Y-axis direction taken at the line $X_{5B}$-$X_{5B}'$ in FIG. 5B-1 showing that the first regrowth mask 320 is patterned with openings in the at least one channel region 304. The openings have widths $W_{C1}$, $W_{C2}$, $W_{C3}$ such that a total width $W_{CTTL}$ is less than the width $W_{SA}$ of the source access region 306 to improve linearity of the GaN device 300. The second example of the GaN device 300 including the at least one channel region 304 may provide improved efficiency due to improved carrier confinement in comparison to the first example of the GaN device 300 having a single channel region 304.

Figure 6C:
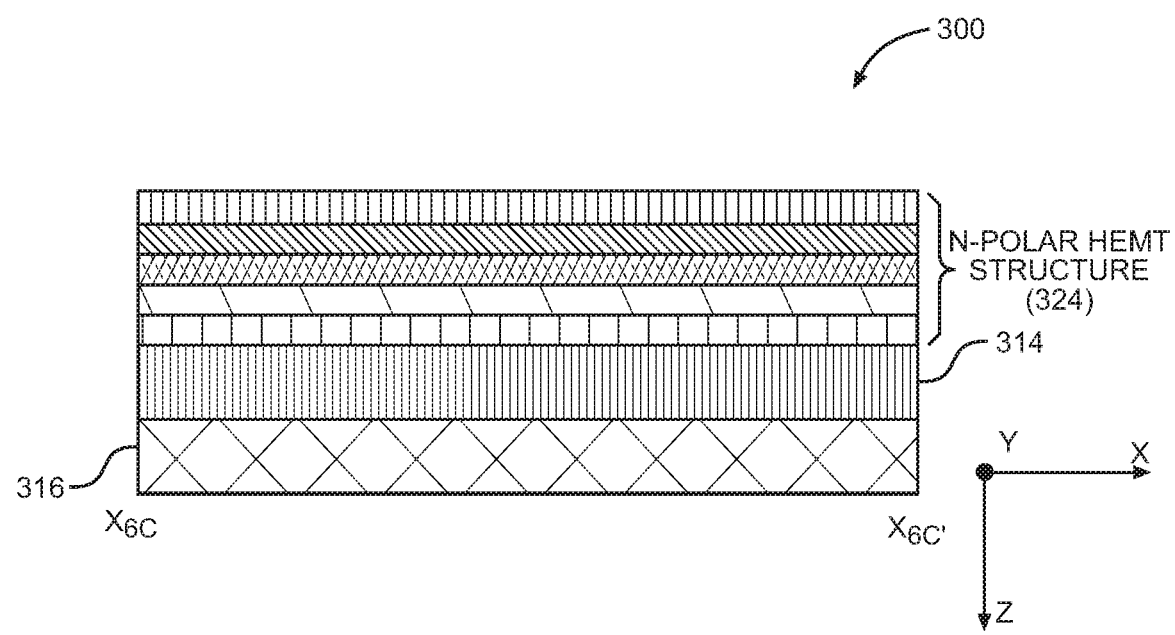

FIGS. 6A-6C are a top view and cross-sectional side views, respectively, of a fabrication stage of the GaN device 300 in the process illustrated in FIG. 2 including forming an N-polar HEMT structure 324 on the GaN buffer 314 in the source access region 306, the drain region 308, and the at least one channel region 304 (block 206, FIG. 2). Forming the N-polar HEMT structure 324 further includes forming a Si-doped and/or germanium (Ge)-doped GaN layer 326 on the N-face top surface 318 of the GaN buffer 314 in the source access region 306, the drain region 308, and the at least one channel region 304, forming a Si-doped and/or Ge-doped AlGaN layer 328 over the Si-doped and/or Ge-doped GaN layer 326, forming an undoped AlGaN layer 330 on the Si-doped and/or Ge-doped AlGaN layer 328, forming an AlN layer 332 on the undoped AlGaN layer 330, and forming a GaN channel layer 334 on the AlN layer 332 as discussed above with reference to FIGS. 3A-3D. The fabrication stage shown in FIGS. 6A-6C is formed by a selective area regrowth process. Layers of the N-polar HEMT structure 324 may be formed by molecular beam epitaxy (MBE) and/or metal-organic chemical vapor deposition (MOCVD), for example, which produce channel regions having side surfaces that are not damaged by a dry etch process. Thus, one of the known sources of surface dispersion is eliminated by the method disclosed herein.

FIG. 6A is a top view in the Z-axis direction of the fabrication stage in which the N-polar HEMT structure 324 is grown in the exposed areas of the N-face top surface 318 on the GaN buffer 314 according to the pattern of the first regrowth mask 320. In particular, the N-polar HEMT structure 324 is formed to have a width $W_{SA}$ in the source access region 306 and in the drain region 308 and the total width $W_{CTTL}$ of the N-polar HEMT structure 324 in the at least one channel region 304. In this regard, a ratio of the width $W_{SA}$ to the width $W_{CTTL}$ contributes to improved linearity in the performance of the GaN device 300. FIG. 6B is a cross-sectional side view in the Y-axis direction taken at the line $X_{6B}$-$X_{6B}'$ in FIG. 6A showing the at least one channel region 304 separated in the X-axis direction by the inactive regions 322. The N-polar HEMT structure 324 is grown in each of the channel regions 304. The at least one channel region 304 provides increased carrier confinement over a single wider channel region 304, for improved efficiency of the GaN device 300. FIG. 6C is a cross-sectional side view in the Y-axis direction taken at the line $X_{6C}$-$X_{6C}'$ in FIG. 6A showing the N-polar HEMT structure 324 in the drain region 308.

Figure 7C:
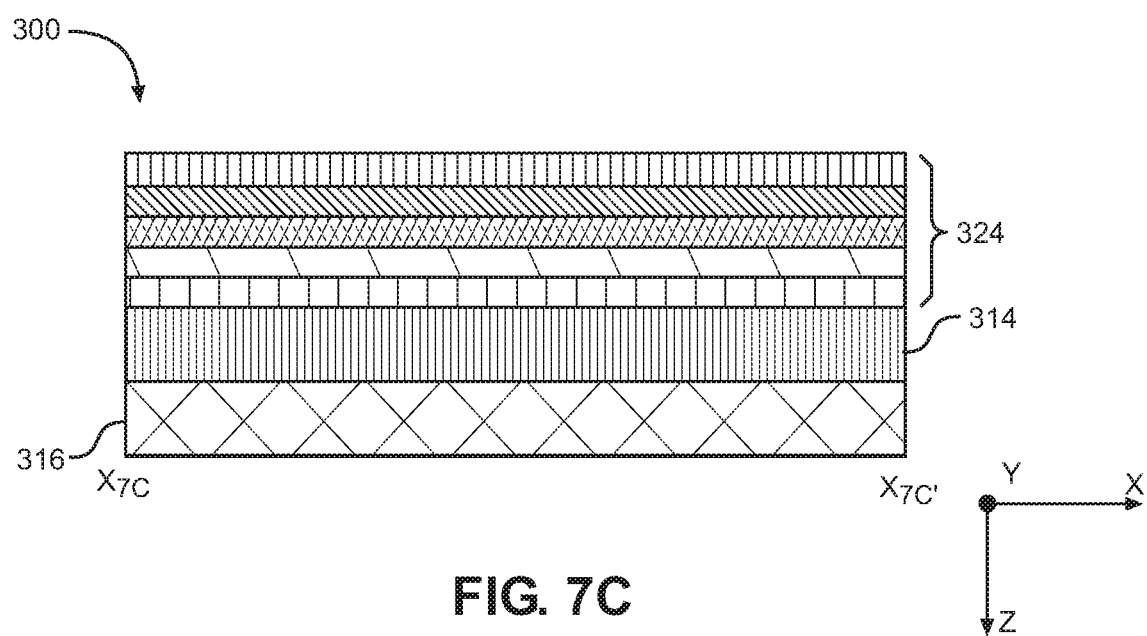

FIGS. 7A-7C are a top view and cross-sectional side views, respectively, of a fabrication stage of the GaN device 300 in the process illustrated in FIG. 2 including forming a second regrowth mask 344 on the first regrowth mask 320 and on the N-polar HEMT structure 324 in the at least one channel region 304 between the source access region 306 and the drain region 308. FIG. 7A is a top view in the Z-axis direction of the fabrication stage in which the second regrowth mask 344 is formed on the N-polar HEMT structures 324 in the channel regions 304 and on the first regrowth mask 320 in the inactive regions 322 on either side of the at least one channel region 304 between the source access region 306 and the drain region 308. FIG. 7B is a side cross-sectional view in the Y-axis direction taken along line $X_{7B}$-$X_{7B}'$ in FIG. 7A showing the second regrowth mask 344 conformally disposed over top surfaces 346T and side surfaces 346S of the N-polar HEMT structures 324 in the channel regions 304 and on the first regrowth mask 320 in the inactive regions 322. FIG. 7C is a cross-sectional side view in the Y-axis direction taken at the line $X_{7C}$-$X_{7C}'$ in FIG. 6A showing that the second regrowth mask 344 is not disposed on the N-polar HEMT structure 324 in the drain region 308. Similarly, the second regrowth mask 344 is not disposed on the N-polar HEMT structure 324 in the source access region 306.

FIGS. 8A-8C are a top view and cross-sectional side views, respectively, of a fabrication stage of the GaN device 300 in the process illustrated in FIG. 2 including forming an undoped GaN layer 338 over the N-polar HEMT structure 324 in the source access region 306 and the drain region 308 (block 208, FIG. 2) on regions of the N-face top surface 318 of the GaN buffer 314 in which the second regrowth mask 344 is not disposed, as shown in FIGS. 7A-7C. The fabrication stage shown in FIGS. 8A-8C also includes removing the second regrowth mask 344 from the GaN device 300. FIG. 8A is a top view in the Z-axis direction showing the undoped GaN layer 338 formed in the source access region 306 and in the drain region 308, but not in the channel regions 304 or the inactive regions 322 in which the second regrowth mask 344 was formed. With the second regrowth mask 344 removed, FIG. 8A shows the top surfaces 346T of the N-polar HEMT structures 324 in the channel regions 304 and the first regrowth mask 320 formed in the inactive regions 322. FIG. 8B is a cross-sectional side view in the Y-axis direction taken at line $X_{8B}$-$X_{8B}'$ in FIG. 8A showing that the undoped GaN layer 338 is not disposed in either the channel regions 304 or the inactive regions 322. FIG. 8C is a cross-sectional side view in the Y-axis direction taken at line $X_{8C}$-$X_{8C}'$ in FIG. 8A showing that the undoped GaN layer 338 is disposed on the GaN channel layer 334 in the drain region 308. The undoped GaN layer 338 in the example in FIGS. 8A-8C may be disposed at a thickness of 500 Å to provide a better carrier confinement of 2DEG and reduce surface dispersion.

Figure 9C:
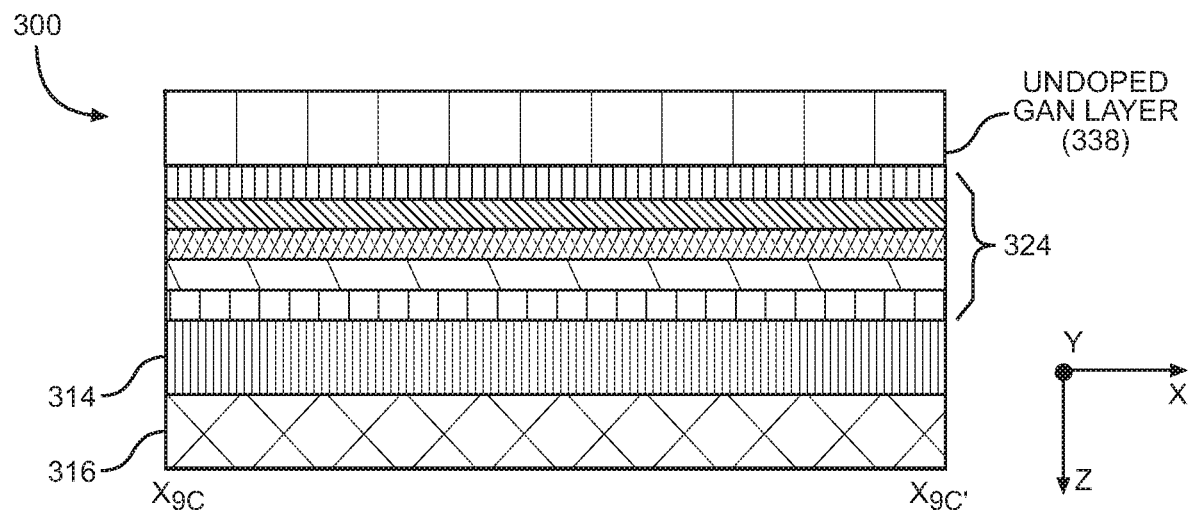
Figure 9D:
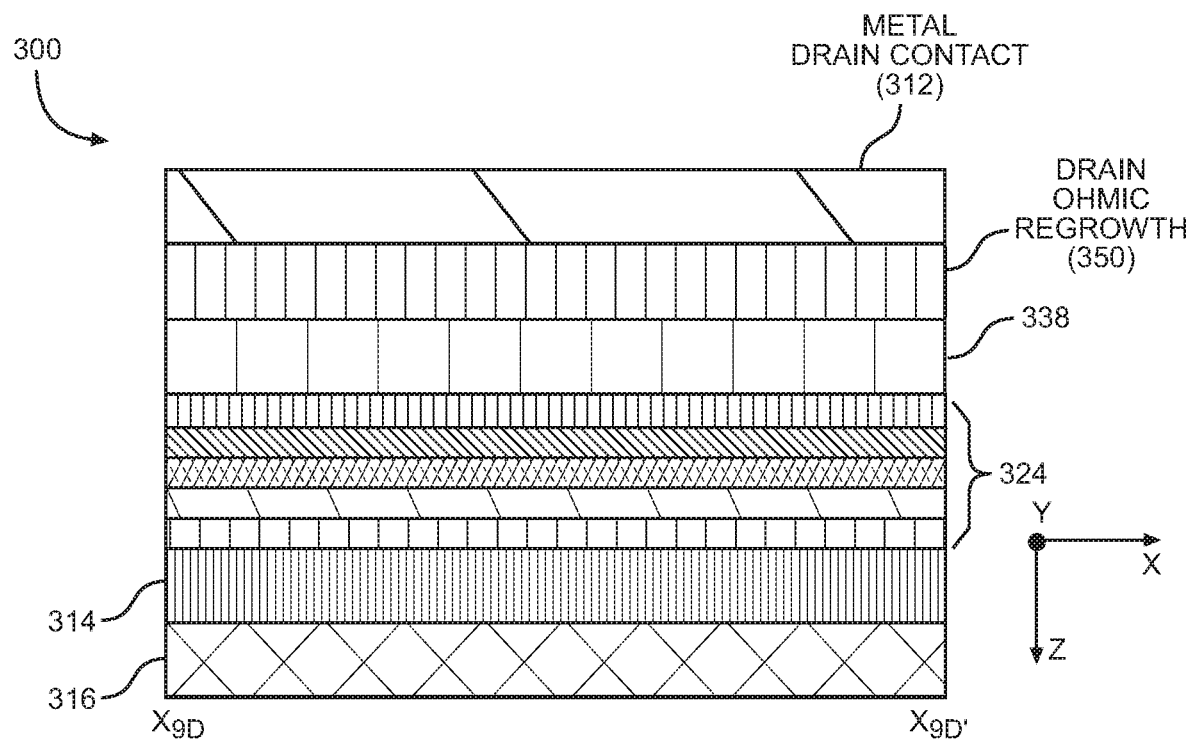

FIGS. 9A-9D are a top view and cross-sectional side views, respectively, of a fabrication stage of the GaN device 300 in the process illustrated in FIG. 2 including forming a metal source contact 310 on the undoped GaN layer 338 in the source access region 306 and a metal drain contact 312 on the drain region 308 (block 210, FIG. 2). Forming the metal source contact 310 and the metal drain contact 312 may further include forming a source ohmic regrowth 348 and a drain ohmic regrowth 350. The source ohmic regrowth 348 and the drain ohmic regrowth 350 are formed by an n+ GaN ohmic regrowth in regions of the source access region 306 and the drain region 308, respectively, in which the metal source contact 310 and the metal drain contact 312 are to be located. The metal source contact 310 and the metal drain contact 312 are formed on the source ohmic regrowth 348 and the drain ohmic regrowth 350 by ohmic metallization. FIG. 9A is a top view in the Z-axis direction showing the metal source contact 310 in the source access region 306 and the metal drain contact 312 in the drain region 308. FIG. 9B is a cross-sectional side view in the Y-axis direction taken at line $X_{9B}$-$X_{9B}'$ in FIG. 9A showing that no ohmic regrowth or ohmic metallization is disposed on the N-polar HEMT structures 324 in the channel regions 304 or on the first regrowth mask 320 in the inactive regions 322. FIG. 9C is a cross-sectional side view in the Y-axis direction taken at line $X_{9C}$-$X_{9C}'$ in FIG. 9A showing that no ohmic regrowth or ohmic metallization is disposed on the undoped GaN layer 338 in the drain region 308 outside of an area in which the metal drain contact 312 is formed. FIG. 9D is a cross-sectional side view in the Y-axis direction taken at line $X_{9D}$-$X_{9D}'$ in FIG. 9A showing the drain ohmic regrowth 350 formed on the undoped GaN layer 338 in the drain region 308 and the metal drain contact 312 formed on the drain ohmic regrowth 350. The layers shown in FIG. 9D correspond to the layers in the source access region 306 at which the metal source contact 310 is formed.

FIGS. 10A-10D are a top view and cross-sectional side views, respectively, of a fabrication stage of the GaN device 300 in the process illustrated in FIG. 2 including forming the self-aligned gate 302 over the at least one channel region (block 212, FIG. 2) to control conduction in the at least one channel region. Forming the self-aligned gate 302 may include forming a gate passivation layer (not shown) on the GaN channel layer 334 and the side surfaces 346S of the N-polar HEMT structures 324 in the at least one channel region 304 and disposing gate metal 352 on the gate passivation layer. Alternatively, forming the self-aligned gate 302 may comprise forming a Schottky contact by disposing the gate metal 352 directly on the GaN channel layer 334 and the side surfaces 346S of the N-polar HEMT structures 324 in the at least one channel region 304. The fabrication stage shown in FIGS. 10A-10D also includes forming the passivation layer 340 on the undoped GaN layer 338 in the source access region 306 and in the drain region 308.

Figure 10C:
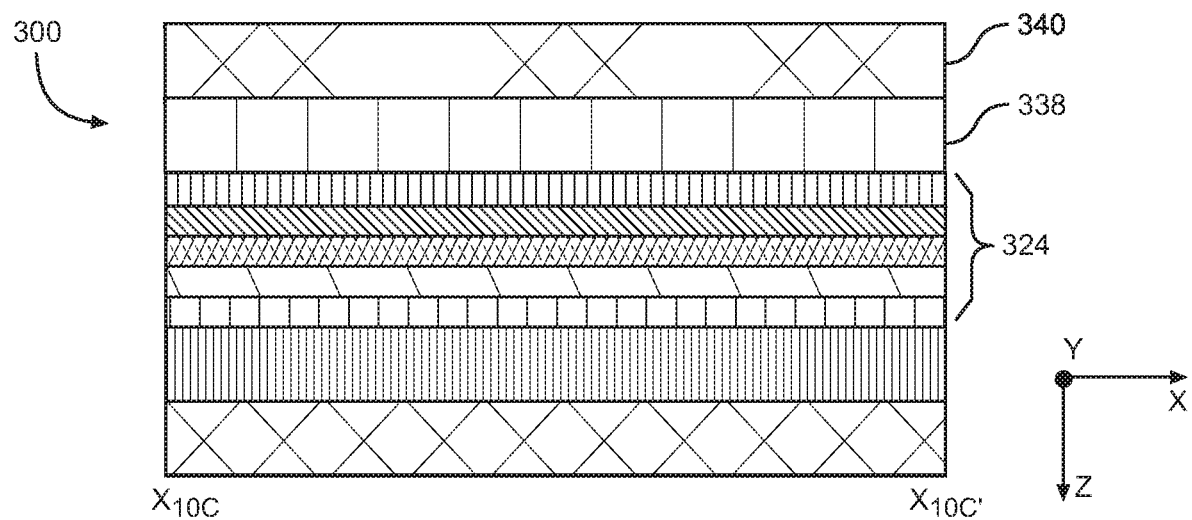
Figure 10D:
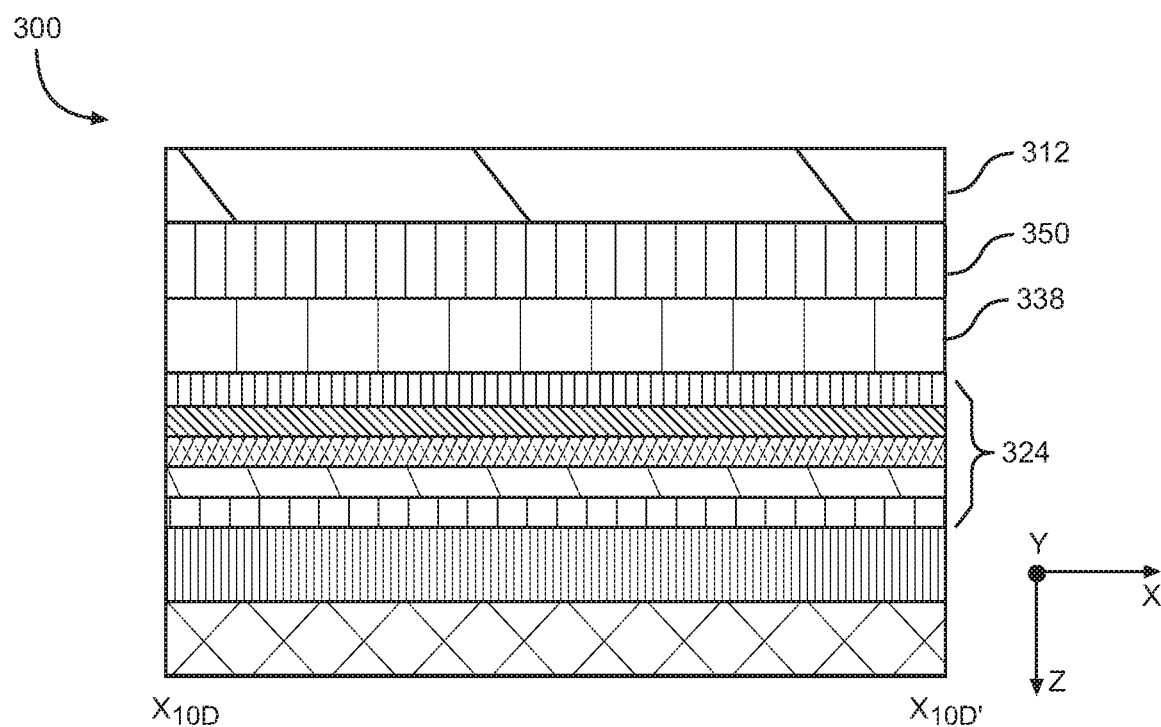

FIG. 10A is a top view in the Z-axis direction showing the passivation layer 340 on the source access region 306 between the metal source contact 310 and the self-aligned gate 302, and on the drain region 308 between the metal drain contact 312 and the self-aligned gate 302. FIG. 10B is a cross-sectional side view in the Y-axis direction taken at line $X_{10B}$-$X_{10B}'$ in FIG. 10A showing the self-aligned gate 302 formed by the gate metal 352 disposed on the GaN channel layer 334 and the side surfaces 346S of the N-polar HEMT structures 324 in each of the channel regions 304 and also on the first regrowth mask 320 in the inactive regions 322. FIG. 10C is a cross-sectional side view in the Y-axis direction taken at line $X_{10C}$-$X_{10C}'$ in FIG. 10A showing the passivation layer 340 formed over the undoped GaN layer 338 in the drain region 308. FIG. 10D is a cross-sectional side view in the Y-axis direction taken at line $X_{10D}$-$X_{10D}'$ in FIG. 10A showing consecutive layers of the N-polar HEMT structure 324, the undoped GaN layer 338, the drain ohmic regrowth 350, and the metal drain contact 312.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Those skilled in the art will recognize improvements and modifications to the preferred embodiments of the present disclosure. All such improvements and modifications are considered within the scope of the concepts disclosed herein and the claims that follow.

What is claimed is:

1. A method of fabricating a semiconductor device comprising:
    forming a gallium-nitride (GaN) buffer on a silicon-carbide (SiC) substrate;
    forming a first regrowth mask comprising a source access region, a drain region, and at least one channel region on the GaN buffer;
    forming a high electron mobility transistor (HEMT) structure on the GaN buffer in the source access region, the drain region, and the at least one channel region;
    forming an undoped GaN layer over the HEMT structure in the source access region and the drain region;
    forming a metal source contact on the undoped GaN layer in the source access region and a metal drain contact on the drain region; and
    forming a self-aligned gate over the at least one channel region.

2. The method of claim 1, wherein forming the GaN buffer further comprises:
    forming an aluminum-nitride (AlN) nucleation layer on a carbon face of the SiC substrate; and
    growing the GaN buffer on the AlN nucleation layer.

3. The method of claim 2, wherein forming the first regrowth mask further comprises:
    depositing the first regrowth mask on a Nitrogen-face (N-face) of the GaN buffer; and
    patterning the first regrowth mask to expose portions of the N-face of the GaN buffer in the source access region, the drain region, and the at least one channel region.

4. The method of claim 3, wherein forming the HEMT structure further comprises:
    forming a silicon-doped GaN layer on the N-face of the GaN buffer in the source access region, the drain region, and the at least one channel region;
    forming a silicon-doped aluminum-gallium-nitride (AlGaN) layer over the silicon-doped GaN layer;
    forming an undoped AlGaN layer on the silicon-doped AlGaN layer;
    forming an aluminum-nitride (AlN) layer on the undoped AlGaN layer; and
    forming a GaN channel layer on the AlN layer.

5. The method of claim 4, wherein forming the undoped GaN layer further comprises:
    forming a second regrowth mask layer on the first regrowth mask and over the HEMT structure in the at least one channel region; and
    removing the second regrowth mask layer.

6. The method of claim 5, further comprising:
    forming a passivation layer on the undoped GaN layer in the source access region and the drain region.

7. The method of claim 4, further comprising
    forming a gate passivation layer on the GaN channel layer and side surfaces of the HEMT structure in the at least one channel region.

8. The method of claim 7, wherein:
    forming the self-aligned gate further comprises disposing gate metal on the gate passivation layer.

9. The method of claim 4, wherein:
    forming the self-aligned gate further comprises forming a Schottky contact by disposing gate metal directly on the GaN channel layer and side surfaces of the HEMT structure in the at least one channel region.

10. The method of claim 1, wherein:
    forming the GaN buffer further comprises forming a planar surface of the GaN buffer having a longitudinal axis in a first direction; and
    patterning the first regrowth mask comprises:
        removing the first regrowth mask in the source access region to expose a first portion of the planar surface of the GaN buffer having a first width extending in a second direction orthogonal to the first direction;
        removing the first regrowth mask in the drain region to expose a second portion of the planar surface of the GaN buffer; and
        removing the first regrowth mask in the at least one channel region to expose at least one third portion of the planar surface of the GaN buffer having a total width in the second direction less than the first width.

11. The method of claim 10, wherein:
    a ratio of the total width in the second direction to the first width is less than 80%.

12. The method of claim 11, wherein:
    the at least one third portion of the planar surface of the GaN buffer extends from the source access region to the drain region.

13. The method of claim 10, wherein:
    exposing the at least one third portion of the planar surface of the GaN buffer in the at least one channel region comprises exposing portions of the planar surface of the GaN buffer in the at least one channel region; and
    the exposed portions of the planar surface of the GaN buffer in the at least one channel region have longitudinal axes in the first direction.

* * * * *